(12) United States Patent
Wang et al.

(10) Patent No.: US 12,107,021 B2
(45) Date of Patent: Oct. 1, 2024

(54) PROCESS MONITORING METHOD AND PROCESS MONITORING SYSTEM

(71) Applicant: CHANGXIN MEMORY TECHNOLOGIES, INC., Hefei (CN)

(72) Inventors: Chunyang Wang, Hefei (CN); Xinran Liu, Hefei (CN); Changli Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 574 days.

(21) Appl. No.: 17/487,819

(22) Filed: Sep. 28, 2021

(65) Prior Publication Data
US 2022/0199474 A1 Jun. 23, 2022

Related U.S. Application Data

(63) Continuation of application No. PCT/CN2021/107900, filed on Jul. 22, 2021.

(30) Foreign Application Priority Data

Dec. 23, 2020 (CN) .......................... 202011543541.0

(51) Int. Cl.
*H01L 21/66* (2006.01)
*H01L 21/311* (2006.01)
*H01L 21/67* (2006.01)

(52) U.S. Cl.
CPC ........ *H01L 22/20* (2013.01); *H01L 21/31105* (2013.01); *H01L 21/67253* (2013.01)

(58) Field of Classification Search
CPC ......... H01L 21/31105; H01L 21/31116; H01L 21/67253; H01L 22/20; H01L 22/34
See application file for complete search history.

(56) References Cited

U.S. PATENT DOCUMENTS

| 8,007,675 B1 | 8/2011 | Labonte et al. |
| 8,748,199 B2 * | 6/2014 | Chumakov ............. H01L 22/26 438/18 |
| 2015/0346709 A1 * | 12/2015 | Han ................. G05B 19/41875 700/195 |

FOREIGN PATENT DOCUMENTS

| CN | 105304514 A | 2/2016 |
| CN | 209822597 U | 12/2019 |
| JP | 2001250812 A | 9/2001 |

OTHER PUBLICATIONS

International Search Report as cited in PCT/CN2021/107900 mailed Oct. 29, 2021, 9 pages.

* cited by examiner

*Primary Examiner* — Jaehwan Oh
(74) *Attorney, Agent, or Firm* — Kilpatrick Townsend & Stockton LLP

(57) ABSTRACT

Embodiments of the present application provide a process monitoring method and a process monitoring system. The process monitoring method includes: acquiring a semiconductor structure on which an etch process is performed in an etch chamber, and forming a corresponding test structure based on the semiconductor structure; acquiring first theoretical mass of the test structure after the etch process is theoretically performed; placing the test structure in the etch chamber to actually perform the etch process, and acquiring first residual mass of the test structure after the etch process is actually performed; and determining, based on the first theoretical mass and the first residual mass, whether an etch state of the etch process performed in the etch chamber is normal.

14 Claims, 7 Drawing Sheets

PROCESS MONITORING METHOD AND PROCESS MONITORING SYSTEM

CROSS-REFERENCE TO RELATED APPLICATIONS

This application is a continuation application of International Patent Application No. PCT/CN2021/107900, filed on Jul. 22, 2021, which claims priority to Chinese Patent Application No. 202011543541.0, filed on Dec. 23, 2020, and both entitled "PROCESS MONITORING METHOD AND PROCESS MONITORING SYSTEM". International Patent Application No. PCT/CN2021/107900 and Chinese Patent Application No. 202011543541.0 are incorporated herein by reference in their entireties.

TECHNICAL FIELD

The present application relates to the field of semiconductor process monitoring, and in particular, to a process monitoring method and a process monitoring system.

BACKGROUND

A Dynamic Random Access Memory (DRAM) stores data by storing charges in a capacitor structure. The larger an aspect ratio of the capacitor structure formed, the larger the capacitance of the capacitor structure, and the more the charges that can be stored.

With the progress of a process and an increasingly smaller feature size of the DRAM, it is increasingly difficult to etch a capacitor structure with a high aspect ratio. An etch defect may be formed during the formation of the capacitor structure with the high aspect ratio, which leads to failure of part of the capacitor structure formed and affects a yield of a semiconductor device.

Conventional detection of an etch process chamber is limited by fewer measuring point positions and long measurement time, and it is difficult to rapidly detect an abnormal condition in the etch process chamber. How to rapidly acquire a state of the etch process chamber to reduce a continuous impact of a defective etching process chamber on products is an urgent problem to be solved currently.

SUMMARY

Embodiments of the present application provide a process monitoring method and a process monitoring system.

The embodiments of the present application provide a process monitoring method, including: acquiring a semiconductor structure on which an etch process is performed in an etch chamber, and forming a corresponding test structure based on the semiconductor structure; acquiring first theoretical mass of the test structure after the etch process is theoretically performed; placing the test structure in the etch chamber to actually perform the etch process, and acquiring first residual mass of the test structure after the etch process is actually performed; and determining, based on the first theoretical mass and the first residual mass, whether an etch state of the etch process performed in the etch chamber is normal.

The embodiments of the present application further provide a process monitoring system, applied to an etch chamber, and including: an etch module configured to perform an etch process; a simulation module configured to acquire a semiconductor structure on which an etch process is performed in the etch module, and generate a corresponding test structure based on the semiconductor structure; a first acquisition module configured to acquire first theoretical mass of the semiconductor structure after the etch process is theoretically performed; a first processing module connected to the etch module and the simulation module, configured to place the test structure in the etch module to actually perform the etch process, and acquire first residual mass of the test structure after the etch process is actually performed; and a first determination module connected to the first acquisition module and the first processing module, configured to determine, based on the first theoretical mass and the first residual mass, whether an etch state of the etch process performed by the etch module is normal.

BRIEF DESCRIPTION OF DRAWINGS

One or more embodiments are exemplarily described by using figures that are corresponding thereto in the accompanying drawings. Unless otherwise particularly stated, the figures in the accompanying drawings do not constitute a scale limitation.

DESCRIPTION OF EMBODIMENTS

Conventional detection of an etch process chamber is limited by fewer measuring point positions and long measurement time, and it is difficult to rapidly detect an abnormal condition in the etch process chamber. How to rapidly acquire a state of the etch process chamber to reduce a continuous impact of a defective etching process chamber on products is an urgent problem to be solved currently.

In order to solve the above problem, a first embodiment of the present application provides a process monitoring method, including: acquiring a semiconductor structure on which an etch process is performed in an etch chamber, and forming a corresponding test structure based on the semiconductor structure; acquiring first theoretical mass of the test structure after the etch process is theoretically performed; placing the test structure in the etch chamber to actually perform the etch process, and acquiring first residual mass of the test structure after the etch process is actually performed; and determining, based on the first theoretical mass and the first residual mass, whether an etch state of the etch process performed in the etch chamber is normal.

In order to make the objectives, technical solutions and advantages of the embodiments of the present application clearer, various embodiments of the present application will be described below in detail with reference to the drawings.

However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below. The embodiments below are divided for the convenience of description, and should not constitute any limitation on specific implementation manners of the present disclosure. The embodiments may be combined with each other and mutually referred to without contradiction.

Figure 1:
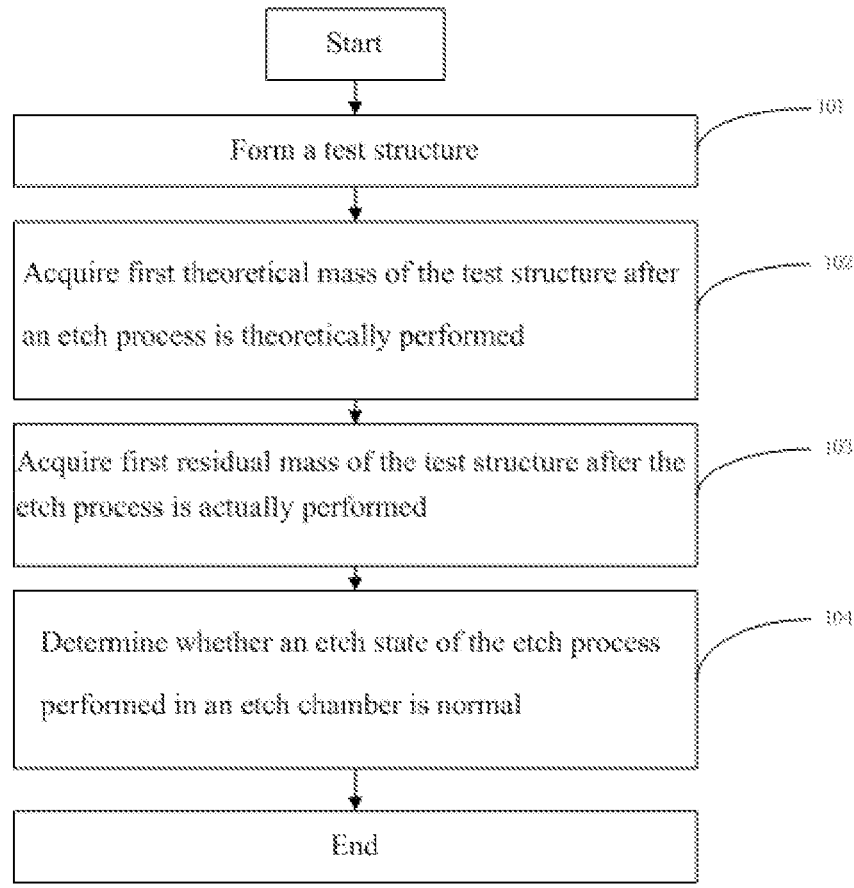
FIG. 1 and FIG. 2 are schematic flowcharts of a process monitoring method according to a first embodiment of the present application.
Figure 2:
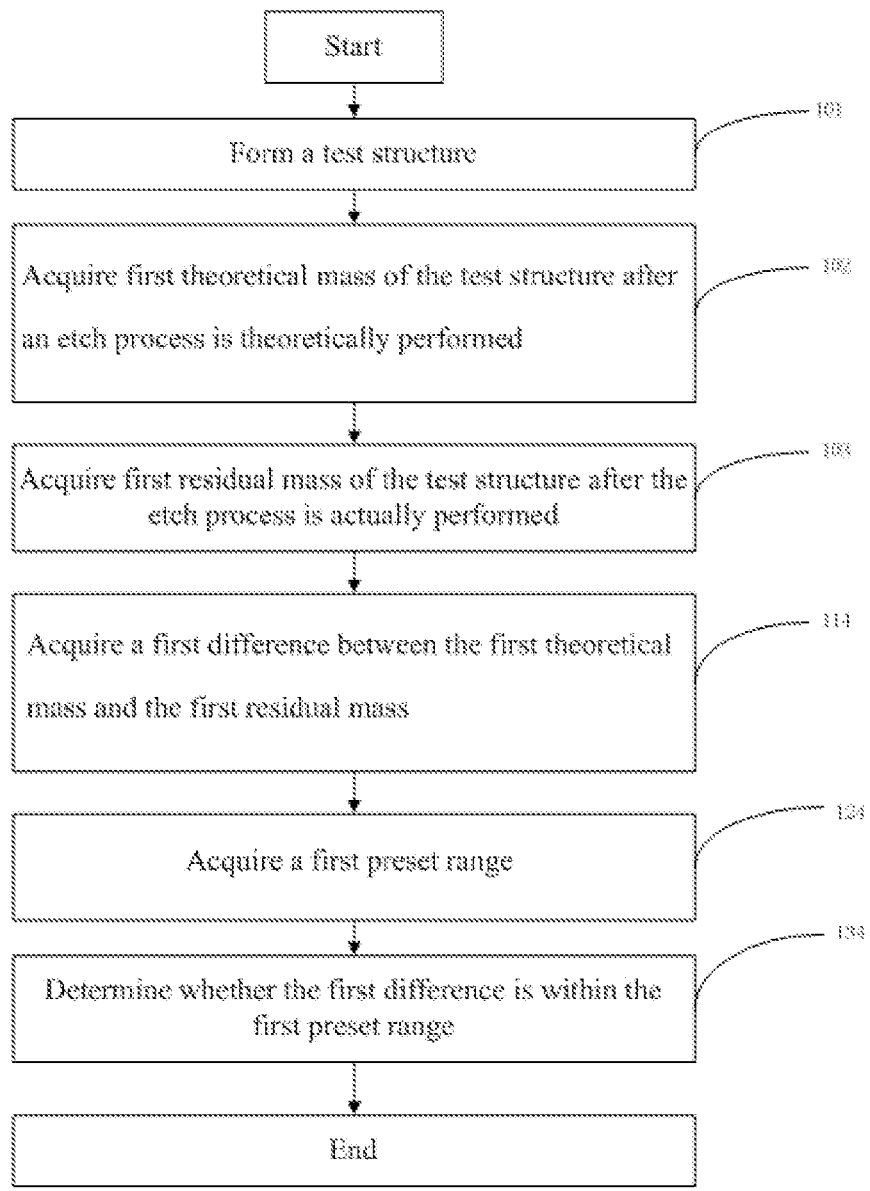
Figure 3:
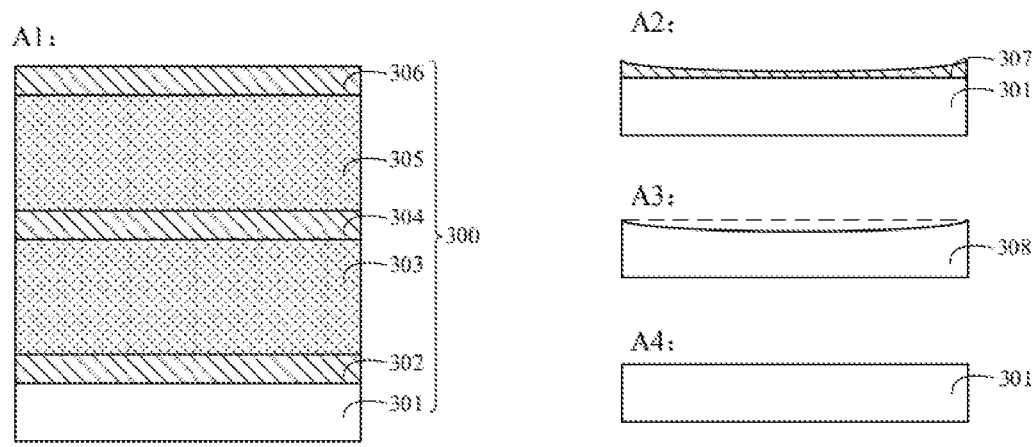
FIG. 3 and FIG. 4 are schematic diagrams of the process monitoring method according to the first embodiment of the present application.
Figure 4:
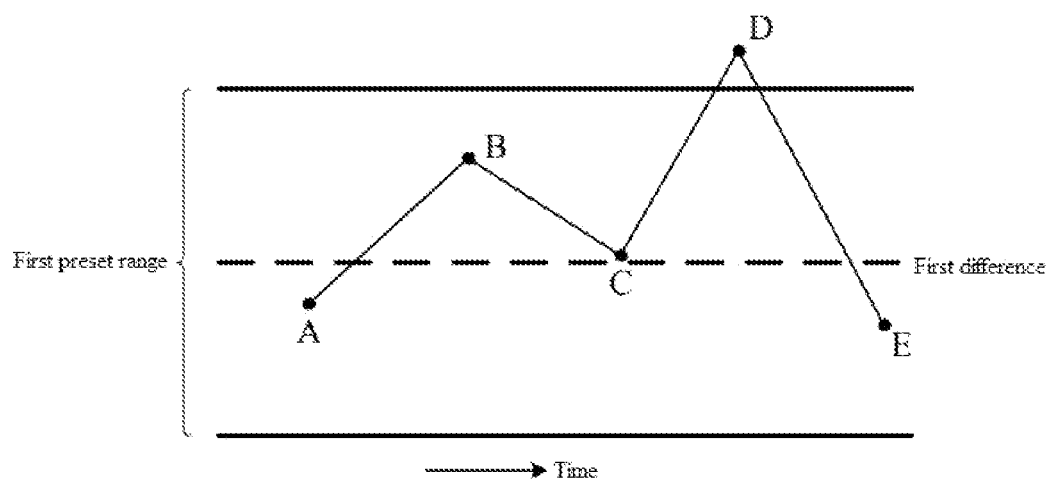
Figure 5:
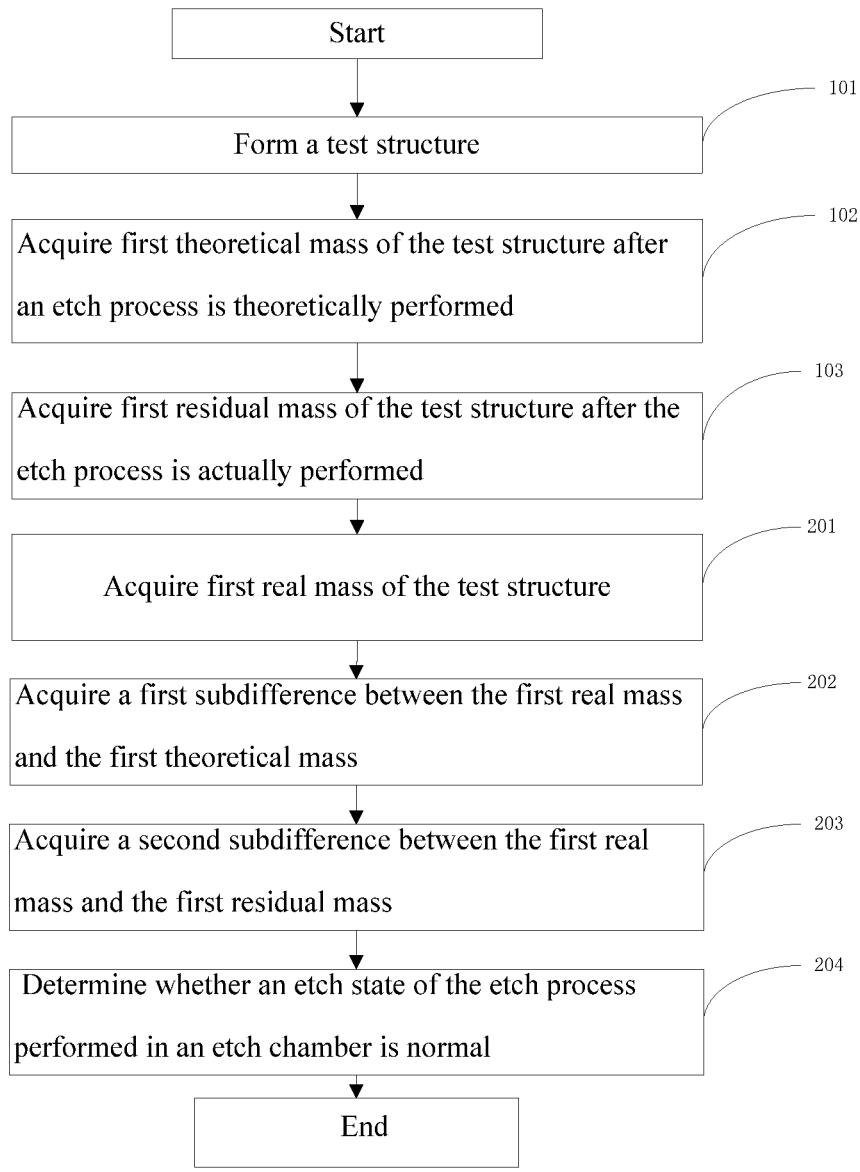
FIG. 5 is a schematic flowchart of another process monitoring method according to the first embodiment of the present application.

FIG. 1 and FIG. 2 are schematic flowcharts of a process monitoring method according to this embodiment, FIG. 3 and FIG. 4 are schematic diagrams of the process monitoring method according to this embodiment, and FIG. 5 is a schematic flowchart of another process monitoring method according to this embodiment. The process monitoring method according to this embodiment is described in detail below with reference to the accompanying drawings, which is specifically as follows.

Referring to FIG. 1, the process monitoring method includes the following steps.

In step 101, a test structure is formed. Specifically, a semiconductor structure on which an etch process is performed in an etch chamber is acquired, and a corresponding test structure is formed based on the semiconductor structure.

In one example, if the semiconductor structure on which the etch process is performed is required to be etched to form a capacitor hole, a to-be-etched structure includes a top dielectric layer, a top sacrificial layer, an intermediate dielectric layer, a bottom sacrificial layer and a bottom dielectric layer sequentially stacked. The top dielectric layer, the intermediate dielectric layer and the bottom dielectric layer are made of silicon nitride, and the top sacrificial layer and the bottom sacrificial layer are made of silicon oxide. The test structure formed in this case is shown by FIG. A1 in FIG. 3. The test structure 300 includes a substrate 301, and a first nitride layer 302, a first oxide layer 303, a second nitride layer 304, a second oxide layer 305 and a third nitride layer 306 located on the substrate 301. By forming the test structure 300 with a consistent etch structure, data acquired by the test structure 300 can accurately represent a state in which the semiconductor structure performs the etch process in the etch chamber.

In step 102, first theoretical mass of the test structure after the etch process is theoretically performed is acquired.

Theoretically, first theoretical mass M1 of the test structure 300 after the etch process is performed is acquired; that is, theoretically, if an etch state of the etch process in the etch chamber is normal, mass of a remaining part of the test structure 300 after the etch process is performed in the etch chamber is M1.

In one example, referring to FIG. A1 and FIG. A4 of FIG. 3, only the substrate 301 of the test structure 300 remains after the etch process is theoretically performed; that is, the first theoretical mass M1 is mass of the substrate 301.

Still referring to FIG. 1, in step 103, first residual mass of the test structure after the etch process is actually performed is acquired. Specifically, the test structure 300 is placed in the etch chamber to actually perform the etch process, and first residual mass m1 of the test structure 300 after the etch process is actually performed is acquired. That is, the test structure 300 is placed in the etch chamber to perform the etch process; in this case, mass of a remaining part of the test structure 300 is m1 after the etch process is performed in the etch chamber.

In one example, with reference to FIG. A1 to FIG. A4 of FIG. 3, after the test structure 300 actually performs the etch process, three situations may occur. When an etch amount is less than a theoretical one, refer to FIG. A2; when the etch amount is greater than the theoretical one, refer to FIG. A3; when the etch amount is close to the theoretical one, refer to FIG. A4.

If the etch amount is less than the theoretical one, an etch remaining structure further includes an etch residual structure 307 located on the substrate 301 in addition to the substrate 301; in this case, the first residual mass m1 is greater than the first theoretical mass M1. If the etch amount is greater than the theoretical one, the etch remaining structure includes only a residual substrate 308; in this case, the first residual mass m1 is less than the first theoretical mass M1. If the etch amount is close to the theoretical one, the etch remaining structure includes only the substrate 301; in this case, the first residual mass m1 is close to the first theoretical mass M1.

Still referring to FIG. 1, in step 104, it is determined whether an etch state of the etch process performed in the etch chamber is normal. Specifically, it is determined, based on the first theoretical mass M1 and the first residual mass m1, whether an etch state of the etch process performed in the etch chamber is normal.

Specifically, referring to FIG. 2, step 104 includes step 114 of acquiring a first difference between the first theoretical mass and the first residual mass, step 124 of acquiring a first preset range, and step 134 of determining whether the first difference is within the first preset range. Step 104 is described in detail below with reference to the accompanying drawings, which is specifically as follows.

In step 114, a first difference between the first theoretical mass and the first residual mass is acquired.

In this embodiment, the first difference $\Delta m1$ is acquired by subtracting the first residual mass m1 from the first theoretical mass M1. If the first difference $\Delta m1$ is a positive value, it indicates that over-etching occurs in the etch chamber. If the first difference $\Delta m1$ is a negative value, it indicates that incomplete etching occurs in the etch chamber.

In other embodiments, the first difference $\Delta m1$ may also be acquired by subtracting the first theoretical mass M1 from the first residual mass m1. If the first difference $\Delta m1$ is a positive value, it indicates that incomplete etching occurs in the etch chamber. If the first difference $\Delta m1$ is a negative value, it indicates that over-etching occurs in the etch chamber.

In step 124, a first preset range is acquired.

The first preset range is acquired through the first theoretical mass and a yield of the semiconductor structure corresponding to the first theoretical mass. Specifically, the first residual mass m1 of the test structure 300 corresponding to the etched excellent semiconductor structure is acquired, and the first preset range is determined according to a difference between the first residual mass m1 and the first theoretical mass M1.

In step 134, it is determined whether the first difference is within the first preset range.

Specifically, it is determined whether the first difference $\Delta m1$ is within the first preset range. If the first difference $\Delta m1$ is within the first preset range, the etch state of the etch process is normal. If the first difference $\Delta m1$ is outside the first preset range, the etch state of the etch process is abnormal, and there is a need to notify related staff to perform inspection, so as to reduce a continuous impact of a defective etching process chamber on products.

In one example, referring to FIG. 4, a dotted line in the drawing indicates that the first difference Δm1 is 0; that is, the etch state of the etch process performed in the etch chamber is theoretical. Point A and Point E in the drawing indicate that incomplete etching exists in the etch process performed in the etch chamber, but an error is within the first preset range; in this case, the etch state of the etch process performed in the etch chamber is considered to be normal. Point B and Point C in the drawing indicate that over-etching exists in the etch process performed in the etch chamber, but an error is within the first preset range; in this case, the etch state of the etch process performed in the etch chamber is considered to be normal. Point D in the drawing indicates that over-etching exists in the etch process performed in the etch chamber, and an error is outside the first preset range; in this case, the etch state of the etch process performed in the etch chamber is considered to be abnormal.

A second manner of determining whether the etch state of the etch process is normal is further provided in this embodiment. Referring to FIG. 5, step 201 is performed after step 103.

In step 201, first real mass of the test structure is acquired.

Specifically, prior to the step of placing the test structure in the etch chamber to actually perform the etch process, the method further includes: acquiring first real mass of the test structure. The first real mass is initial mass of the test structure.

In step 202, a first sub-difference between the first real mass and the first theoretical mass is acquired.

The first sub-difference represents an etch loss of the test structure after the etch process in a theoretical situation.

In step 203, a second sub-difference between the first real mass and the first residual mass is acquired.

The second sub-difference represents an etch loss of the test structure after the etch process in an actual situation.

In step 204, it is determined whether the etch state of the etch process performed in the etch chamber is normal.

Specifically, it is determined, based on the first sub-difference and the second sub-difference, whether the etch state of the etch process performed in the etch chamber is normal.

Further, a second difference between the first sub-difference and the second sub-difference is acquired, and it is determined whether the second difference is within the first preset range. If the second difference is within the first preset range, the etch state of the etch process performed in the etch chamber is normal. If the second difference is outside the first preset range, the etch state of the etch process performed in the etch chamber is abnormal.

It is to be noted that the etch process in this embodiment includes a high-aspect-ratio etch process.

Compared with the related art, a structurally consistent test structure is formed based on the semiconductor structure on which the etch process is performed in the etch chamber, and first theoretical mass of the test structure after the etch process is theoretically performed is acquired; then, the test structure is placed in the etch chamber to actually perform the etch process, and first residual mass of the test structure after the etch process is performed is acquired; the first theoretical mass is compared with the first residual mass to determine a difference between a current etch state of the etch chamber and a theoretical etch state, which is accurate. In addition, an etch state of the etch chamber is measured through the mass of the test structure, and the etch state of the etch chamber can be rapidly acquired due to easy acquisition of the mass.

Division of the steps above is only for ease of description, and during implementation, the steps may be combined into one step or some steps may be split into multiple steps, all of which shall fall within the protection scope of the patent provided that a same logical relationship is included. Insignificant modifications added to or insignificant designs introduced in a procedure without changing the core of the procedure shall fall within the protection scope of the patent.

A second embodiment of the present application relates to a process monitoring method. Different from the first embodiment, the second embodiment further includes determining a byproduct generation state of the etch process performed in the etch chamber on the basis of the first embodiment.

Figure 6:
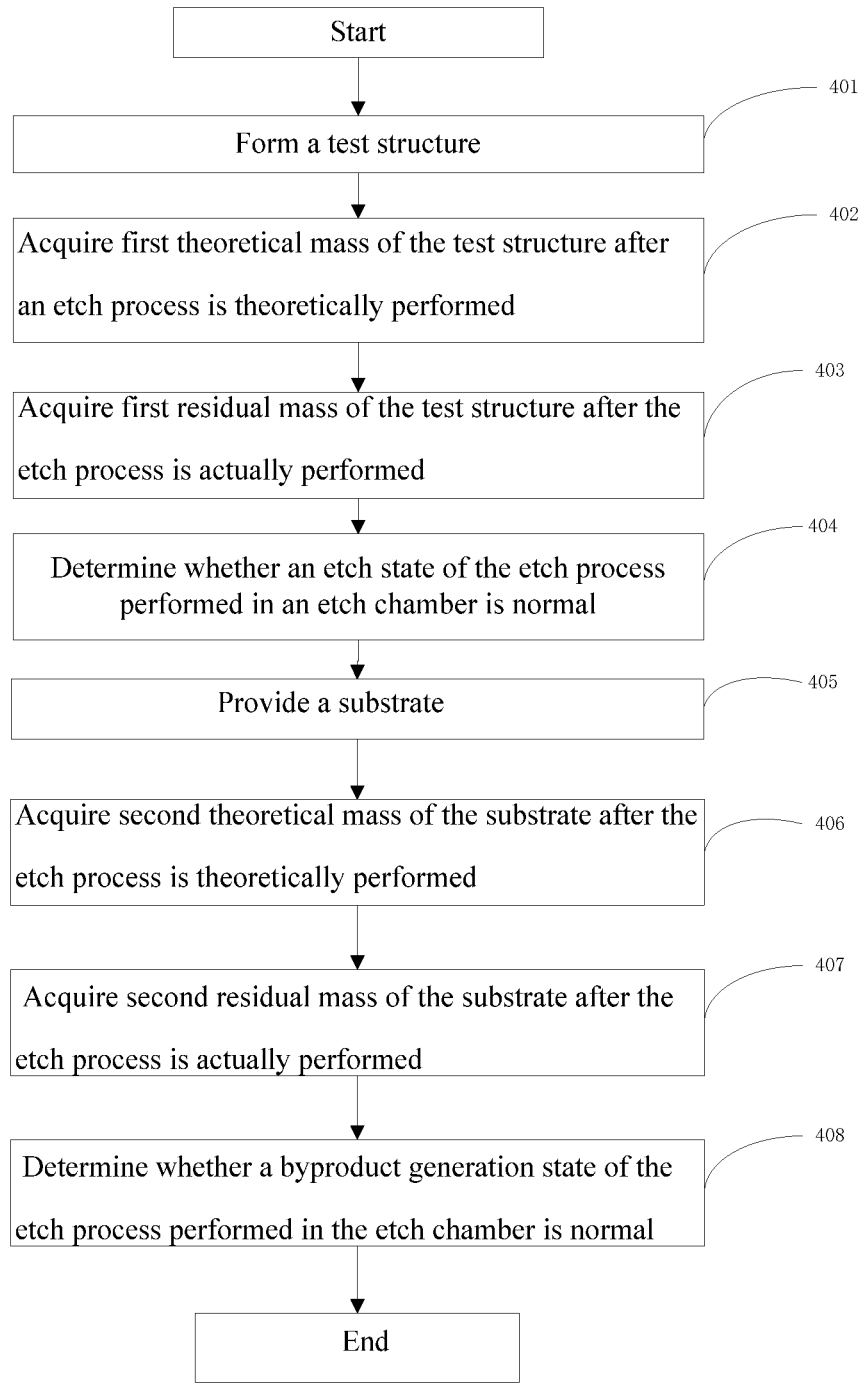
FIG. 6 is a schematic flowchart of a process monitoring method according to a second embodiment of the present application.
Figure 7:
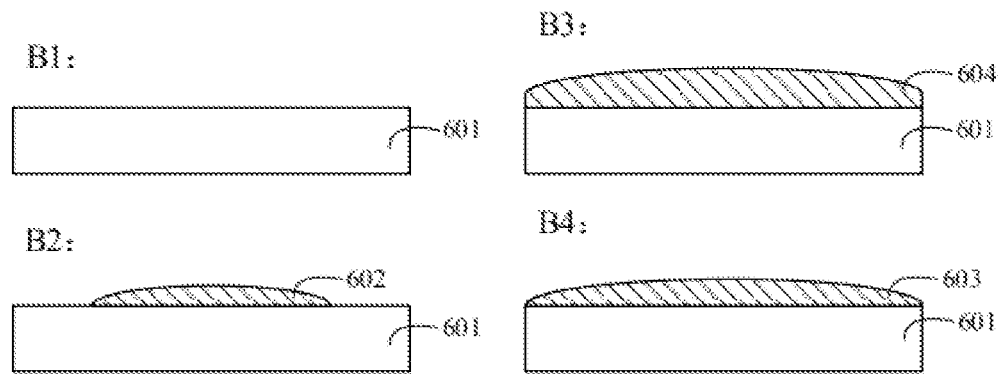
FIG. 7 and FIG. 8 are schematic diagrams of the process monitoring method according to the second embodiment of the present application.
Figure 8:
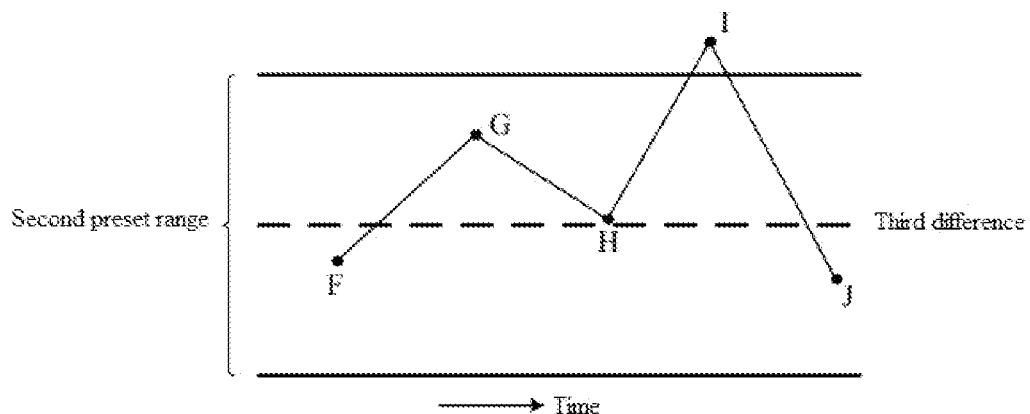

FIG. 6 is a schematic flowchart of a process monitoring method according to a second embodiment of the present application, and FIG. 7 and FIG. 8 are schematic diagrams of the process monitoring method according to the second embodiment of the present application. The process monitoring method according to this embodiment is described in detail below with reference to the accompanying drawings. Contents the same or corresponding to those in the first embodiment are not described in detail below.

Referring to FIG. 6, the process monitoring method includes the following steps.

In step 401, a test structure is formed.

In step 402, first theoretical mass of the test structure after the etch process is theoretically performed is acquired.

In step 403, first residual mass of the test structure after the etch process is actually performed is acquired.

In step 404, it is determined whether an etch state of the etch process performed in the etch chamber is normal.

Step 401 to step 404 are the same as step 101 to step 104 in the first embodiment respectively, and are not described in detail in this embodiment.

In this embodiment, the byproduct generation state of the etch process is measured by a mixed etch gas $C_4F_8:C_4F_6:O_2=3:4:1$, and an etch time is 40 s to 80 s, for example, 50 s, 60 s or 70 s. In this embodiment, the etch time is 60 s; a power supply has a power of 7 kw to 9 kw, for example, 7.5 kw, 8.0 kw or 8.5 kw. It is easy to form byproducts on the substrate by using a mixed etch gas of carbon and fluorine.

In step 405, a substrate is provided.

In step 406, second theoretical mass of the substrate after the etch process is theoretically performed is acquired.

Theoretically, second theoretical mass M2 of the substrate after the etch process is performed is acquired; that is, theoretically, if the byproduct generation state of the etch process in the etch chamber is normal, mass of a remaining part of the substrate after the etch process is performed in the etch chamber is M2.

In one example, referring to FIG. B1 and FIG. B4 of FIG. 7, a first-thickness byproduct 603 is generated on the substrate 601 after the substrate 601 performs the etch process theoretically; that is, the second theoretical mass M2 is a sum of mass of the substrate 601 and mass of the first-thickness byproduct 603.

Still referring to FIG. 6, in step 407, second residual mass of the substrate after the etch process is actually performed is acquired. Specifically, the substrate is placed in the etch chamber to actually perform the etch process, and second residual mass m2 of the substrate after the etch process is actually performed is acquired. That is, the substrate is placed in the etch chamber to perform the etch process; in this case, mass of a remaining part of the substrate after the etch process is performed in the etch chamber is m2.

In one example, with reference to FIG. B1 to FIG. B4 of FIG. 7, after the substrate 601 actually performs the etch process, three situations may occur. When a byproduct generation amount is less than a theoretical one, refer to FIG. B2; when the byproduct generation amount is greater than the theoretical one, refer to FIG. B3; when the byproduct generation amount is close to the theoretical one, refer to FIG. B4.

If the byproduct generation amount is less than the theoretical one, a second-thickness byproduct 602 is formed on the substrate 601, and the second-thickness byproduct 602 is thinner than the first-thickness byproduct 603; in this case, the second residual mass m2 is less than the second theoretical mass M2. If the byproduct generation amount is greater than the theoretical one, a third-thickness byproduct 604 is formed on the substrate 601, and the third-thickness byproduct 604 is thicker than the first-thickness byproduct 603; in this case, the second residual mass m2 is greater than the second theoretical mass M2. If the byproduct generation amount is close to the theoretical one, the second residual mass m2 is close to the second theoretical mass M2.

Still referring to FIG. 6, in step 408, it is determined whether a byproduct generation state of the etch process performed in the etch chamber is normal. Specifically, it is determined, based on the second theoretical mass and the second residual mass, whether the byproduct generation state of the etch process performed in the etch chamber is normal.

Specifically, a third difference between the second theoretical mass and the second residual mass is acquired.

In this embodiment, the third difference $\Delta m3$ is acquired by subtracting the second residual mass m2 from the second theoretical mass M2. If the third difference $\Delta m3$ is a positive value, it indicates that the byproduct generation amount in the etch chamber is small. If the third difference $\Delta m3$ is a negative value, it indicates that the byproduct generation amount in the etch chamber is large.

In other embodiments, the third difference $\Delta m3$ may also be acquired by subtracting the second theoretical mass M2 from the second residual mass m2. If the third difference $\Delta m3$ is a positive value, it indicates that the byproduct generation amount in the etch chamber is large. If the third difference $\Delta m3$ is a negative value, it indicates that the byproduct generation amount in the etch chamber is small.

It is determined whether the third difference is within a second preset range. If the third difference is within the second preset range, the byproduct generation state of the etch process is normal. If the third difference is outside the second preset range, the byproduct generation state of the etch process is abnormal, and there is a need to notify related staff to perform inspection, so as to reduce a continuous impact of a defective etching process chamber on products.

The second preset range is acquired through the second theoretical mass and a yield of the semiconductor structure corresponding to the second theoretical mass. Specifically, second residual mass generated by the substrate and the byproduct corresponding to the etched excellent semiconductor structure is acquired, and the second preset range is determined according to a difference between the second residual mass and the second theoretical mass.

In one example, referring to FIG. 8, a dotted line in the drawing indicates that the third difference $\Delta m3$ is 0; that is, the byproduct generation state of the etch process performed in the etch chamber is theoretical. Point F and Point J in the drawing indicate that the byproduct generation state of the etch process performed in the etch chamber is less than a normal value, but an error is within the second preset range; in this case, the byproduct generation state of the etch process performed in the etch chamber is considered to be normal. Point G and Point H in the drawing indicate that the byproduct generation state of the etch process performed in the etch chamber is greater than the normal value, but an error is within the second preset range; in this case, the byproduct generation state of the etch process performed in the etch chamber is considered to be normal. Point I in the drawing indicates that the byproduct generation state of the etch process performed in the etch chamber is greater than the normal value, and an error is outside the second preset range; in this case, the byproduct generation state of the etch process performed in the etch chamber is considered to be abnormal.

A second manner of determining whether the byproduct generation state of the etch process is normal is further provided in this embodiment, which is specifically as follows.

Prior to the step of placing the substrate in the etch chamber to actually perform the etch process, the method further includes: acquiring second real mass of the substrate. The second real mass is initial mass of the substrate.

A third sub-difference between the second real mass and the second theoretical mass is acquired. The third sub-difference represents a byproduct generation amount of the substrate after the etch process in a theoretical situation. A fourth sub-difference between the second real mass and the second theoretical mass is acquired. The fourth sub-difference represents a byproduct generation amount of the substrate after the etch process in an actual situation.

It is determined, based on the third sub-difference and the fourth sub-difference, whether the byproduct generation state of the etch process performed in the etch chamber is normal.

Specifically, a fourth difference between the third sub-difference and the fourth sub-difference is acquired, and it is determined whether the fourth difference is within the second preset range. If the fourth difference is within the second preset range, the byproduct generation state of the etch process performed in the etch chamber is normal. If the fourth difference is outside the second preset range, the etch state of the etch process performed in the etch chamber is abnormal.

It is to be noted that, in other embodiments, it may also be determined, based on the etch state and the byproduct generation state, whether the etch process is in a normal state. For example, more byproduct generation can make up for some over-etching defects, and less byproduct generation can make up for some insufficient etching defects. It is more comprehensive and accurate to evaluate whether the etch process is in the normal state by combining the etch state and the byproduct generation state of the etch process.

Compared with the related art, a structurally consistent test structure is formed based on the semiconductor structure on which the etch process is performed in the etch chamber, and first theoretical mass of the test structure after the etch process is theoretically performed is acquired; then, the test structure is placed in the etch chamber to actually perform the etch process, and first residual mass of the test structure after the etch process is performed is acquired; the first theoretical mass is compared with the first residual mass to determine a difference between a current etch state of the etch chamber and a theoretical etch state, which is accurate. In addition, an etch state of the etch chamber is measured through the mass of the test structure, and the etch state of the etch chamber can be rapidly acquired due to easy acquisition of the mass.

Division of the steps above is only for ease of description, and during implementation, the steps may be combined into one step or some steps may be split into multiple steps, all of which shall fall within the protection scope of the patent provided that a same logical relationship is included. Insignificant modifications added to or insignificant designs introduced in a procedure without changing the core of the procedure shall fall within the protection scope of the patent.

Since the first embodiment is corresponding to this embodiment, this embodiment can collaborate with the first embodiment for implementation. Related technical details described in the first embodiment are still valid in this embodiment, and technical effects that can be achieved in the first embodiment may also be achieved in this embodiment, and are not described herein to avoid repetition. Correspondingly, related technical details described in this embodiment may also be applied to the first embodiment.

A third embodiment of the present application provides a process monitoring system.

Figure 9:
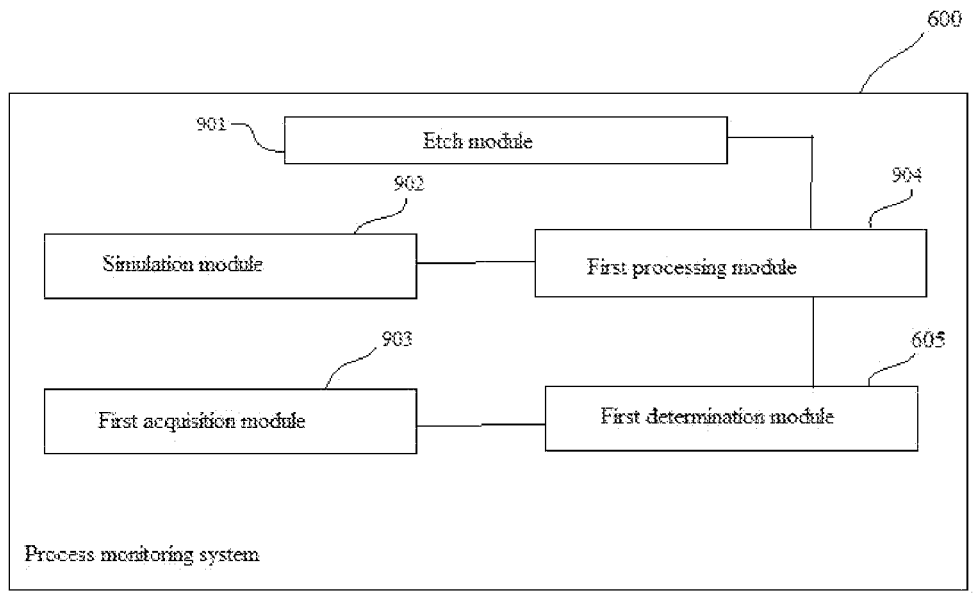
FIG. 9 and FIG. 10 are schematic structural diagrams of a process monitoring system according to a third embodiment of the present application.
Figure 10:
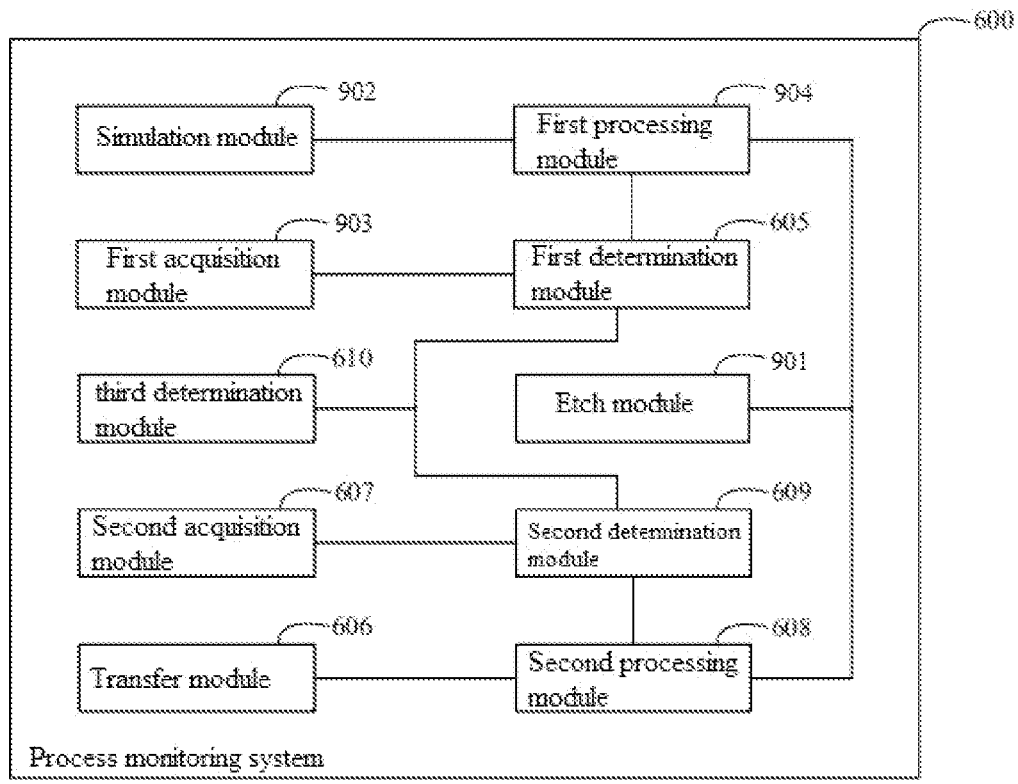

FIG. 9 and FIG. 10 are schematic structural diagrams of a process monitoring system according to a third embodiment of the present application. The process monitoring system according to this embodiment is described in detail below with reference to the accompanying drawings. Contents the same or corresponding to those in the first embodiment and the second embodiment are not described in detail below.

Referring to FIG. 9, the process monitoring system 600 includes:
  an etch module 901 configured to perform an etch process;
  a simulation module 902 configured to acquire a semiconductor structure on which an etch process is performed in the etch module 901, and generate a corresponding test structure based on the semiconductor structure;
  a first acquisition module 903 configured to acquire first theoretical mass of the semiconductor structure after the etch process is theoretically performed;
  a first processing module 904 connected to the etch module 901 and the simulation module 902, configured to place the test structure in the etch module 901 to actually perform the etch process, and acquire first residual mass of the test structure after the etch process is actually performed; and
  a first determination module 605 connected to the first acquisition module 903 and the first processing module 904, configured to determine, based on the first theoretical mass and the first residual mass, whether an etch state of the etch process performed by the etch module 901 is normal.

In one example, if the semiconductor structure on which the etch process is performed is required to be etched to form a capacitor hole, a to-be-etched structure includes a top dielectric layer, a top sacrificial layer, an intermediate dielectric layer, a bottom sacrificial layer and a bottom dielectric layer sequentially stacked. The top dielectric layer, the intermediate dielectric layer and the bottom dielectric layer are made of silicon nitride, and the top sacrificial layer and the bottom sacrificial layer are made of silicon oxide. The test structure formed in this case is shown by FIG. A1 in FIG. 3. The test structure 300 includes a substrate 301, and a first nitride layer 302, a first oxide layer 303, a second nitride layer 304, a second oxide layer 305 and a third nitride layer 306 located on the substrate. By forming the test structure 300 with a consistent etch structure, data acquired by the test structure 300 can accurately represent a state in which the semiconductor structure performs the etch process in the etch chamber.

In this embodiment, it is determined, according to whether a first difference between the first theoretical mass and the first residual mass is within a first preset range, whether the etch state of the etch process performed by the etch module 901 is normal.

Specifically, the first difference $\Delta m1$ is acquired by subtracting the first residual mass m1 from the first theoretical mass M1. If the first difference $\Delta m1$ is a positive value, it indicates that over-etching occurs in the etch chamber. If the first difference $\Delta m1$ is a negative value, it indicates that incomplete etching occurs in the etch chamber.

The first preset range is acquired through the first theoretical mass and a yield of the semiconductor structure corresponding to the first theoretical mass. Specifically, the first residual mass of the test structure corresponding to the etched excellent semiconductor structure is acquired, and the first preset range is determined according to a difference between the first residual mass and the first theoretical mass.

In one example, referring to FIG. 4, a dotted line in the drawing indicates that the first difference $\Delta m1$ is 0; that is, the etch state of the etch process performed in the etch chamber is theoretical. Point A and Point E in the drawing indicate that incomplete etching exists in the etch process performed in the etch chamber, but an error is within the first preset range; in this case, the etch state of the etch process performed in the etch chamber is considered to be normal. Point B and Point C in the drawing indicate that over-etching exists in the etch process performed in the etch chamber, but an error is within the first preset range; in this case, the etch state of the etch process performed in the etch chamber is considered to be normal. Point D in the drawing indicates that over-etching exists in the etch process performed in the etch chamber, and an error is outside the first preset range; in this case, the etch state of the etch process performed in the etch chamber is considered to be abnormal.

Referring to FIG. 10, in this embodiment, the process monitoring system 600 further includes:
  a transfer module 606 configured to provide a substrate;
  a second acquisition module 607 configured to acquire second theoretical mass of the substrate after the etch process is theoretically performed;
  a second processing module 608 connected to the etch module 901 and the transfer module 606, configured to place the substrate in the etch module 901 to actually perform the etch process, and acquire second residual mass of the substrate after the etch process is actually performed; and
  a second determination module 609 connected to the second acquisition module 607 and the second processing module 608, configured to determine, based on the second theoretical mass and the second residual mass, whether a byproduct generation state of the etch process performed by the etch module 901 is normal.

In this embodiment, it is determined, according to whether a third difference between the second theoretical mass and the second residual mass is within a second preset range, whether the byproduct generation state of the etch process performed by the etch module 901 is normal.

Specifically, the third difference $\Delta m3$ is acquired by subtracting the second residual mass m2 from the second theoretical mass M2. If the third difference $\Delta m3$ is a positive value, it indicates that the byproduct generation amount in the etch chamber is small. If the third difference Δm3 is a negative value, it indicates that the byproduct generation amount in the etch chamber is large.

The second preset range is acquired through the second theoretical mass and a yield of the semiconductor structure corresponding to the second theoretical mass. Specifically, second residual mass generated by the substrate and the byproduct corresponding to the etched excellent semiconductor structure is acquired, and the second preset range is determined according to a difference between the second residual mass and the second theoretical mass.

In one example, referring to FIG. 8, a dotted line in the drawing indicates that the third difference Δm3 is 0; that is, the byproduct generation state of the etch process performed in the etch chamber is theoretical. Point F and Point J in the drawing indicate that the byproduct generation state of the etch process performed in the etch chamber is less than a normal value, but an error is within the second preset range; in this case, the byproduct generation state of the etch process performed in the etch chamber is considered to be normal. Point G and Point H in the drawing indicate that the byproduct generation state of the etch process performed in the etch chamber is greater than the normal value, but an error is within the second preset range; in this case, the byproduct generation state of the etch process performed in the etch chamber is considered to be normal. Point I in the drawing indicates that the byproduct generation state of the etch process performed in the etch chamber is greater than the normal value, and an error is outside the second preset range; in this case, the byproduct generation state of the etch process performed in the etch chamber is considered to be abnormal.

Still referring to FIG. 10, in this embodiment, the process monitoring system 600 further includes: a third determination module 610 connected to the first determination module 605 and the second determination module 609, configured to determine, based on the etch state and the byproduct generation state, whether the etch process is in a normal state. It is more comprehensive and accurate to evaluate whether the etch process is in the normal state by combining the etch state and the byproduct generation state of the etch process.

Compared with the related art, first theoretical mass of a test structure after an etch process is theoretically performed is acquired through the first acquisition module, first residual mass of the test structure after the etch process is actually performed is acquired through the first processing module, and the first determination module determines a difference between a current etch state of the etch chamber and a theoretical etch state based on a comparison between the first theoretical mass and the first residual mass, which is accurate. In addition, an etch state of the etch chamber is measured through the mass of the test structure, and the etch state of the etch chamber can be rapidly acquired due to easy acquisition of the mass.

It should be noted that all the modules involved in this embodiment are logical modules. In practical application, a logical unit may be a physical unit or a part of the physical unit, or may be implemented through a combination of a plurality of physical units. In addition, in order to highlight the innovative portion of the present application, units that are not closely related to the technical problem set forth in the present application are not introduced in this embodiment, which, however, does not indicate that other units do not exist in this embodiment.

Since the first embodiment and the second embodiment are corresponding to this embodiment, this embodiment can collaborate with the first embodiment and the second embodiment for implementation. Related technical details described in the first embodiment and the second embodiment are still valid in this embodiment, and technical effects that can be achieved in the first embodiment and the second embodiment may also be achieved in this embodiment, and are not described herein to avoid repetition. Correspondingly, related technical details described in this embodiment may also be applied to the first embodiment and the second embodiment.

Those of ordinary skill in the art may understand that the above embodiments are specific embodiments for implementing the present application. However, in practical applications, various changes in forms and details may be made thereto without departing from the spirit and scope of the present application.

What is claimed is:

1. A process monitoring method, comprising:
    acquiring a semiconductor structure on which an etch process is performed in an etch chamber, and forming a corresponding test structure based on the semiconductor structure;
    acquiring first theoretical mass of the test structure after the etch process is theoretically performed;
    placing the test structure in the etch chamber to actually perform the etch process, and acquiring first residual mass of the test structure after the etch process is actually performed; and
    determining, based on the first theoretical mass and the first residual mass, whether an etch state of the etch process performed in the etch chamber is normal; and, wherein the process monitoring method further comprises:
    providing a substrate, and acquiring second theoretical mass of the substrate after the etch process is theoretically performed;
    placing the substrate in the etch chamber to actually perform the etch process, and acquiring second residual mass of the substrate after the etch process is actually performed; and
    determining, based on the second theoretical mass and the second residual mass, whether a byproduct generation state of the etch process performed in the etch chamber is normal; and, wherein determining whether the byproduct generation state of the etch process performed in the etch chamber is normal comprises:
    acquiring a third difference between the second theoretical mass and the second residual mass; and
    determining whether the third difference is within a second preset range, the byproduct generation state of the etch process being normal if the third difference is within the second preset range.

2. The process monitoring method according to claim 1, wherein the step of determining whether an etch state of the etch process performed in the etch chamber is normal comprises the following steps:
    acquiring a first difference between the first theoretical mass and the first residual mass; and
    determining whether the first difference is within a first preset range, the etch state being normal if the first difference is within the first preset range.

3. The process monitoring method according to claim 1, prior to the step of placing the test structure in the etch chamber to actually perform the etch process, further comprising: acquiring first real mass of the test structure;
    the step of determining, based on the first theoretical mass and the first residual mass, whether an etch state of the etch process performed in the etch chamber is normal comprising the following steps:
acquiring a first sub-difference between the first real mass and the first theoretical mass;
acquiring a second sub-difference between the first real mass and the first residual mass; and
determining, based on the first sub-difference and the second sub-difference, whether the etch state of the etch process performed in the etch chamber is normal.

4. The process monitoring method according to claim 3, prior to the step of determining, based on the first theoretical mass and the first residual mass, whether an etch state of the etch process performed in the etch chamber is normal comprises the following steps: acquiring a second difference between the first sub-difference and the second sub-difference, and determining whether the second difference is within a first preset range, the etch state being normal if the second difference is within the first preset range.

5. The process monitoring method according to claim 2, wherein the first preset range is acquired through the first theoretical mass and a yield of the semiconductor structure corresponding to the first theoretical mass.

6. The process monitoring method according to claim 4, wherein the first preset range is acquired through the first theoretical mass and a yield of the semiconductor structure corresponding to the first theoretical mass.

7. The process monitoring method according to claim 1, prior to the step of placing the substrate in the etch chamber to actually perform the etch process, further comprising: acquiring second real mass of the substrate;
the step of determining, based on the second theoretical mass and the second residual mass, whether a byproduct generation state of the etch process performed in the etch chamber is normal comprising the following steps:
acquiring a third sub-difference between the second real mass and the second theoretical mass;
acquiring a fourth sub-difference between the second real mass and the second theoretical mass; and
determining, based on the third sub-difference and the fourth sub-difference, whether the byproduct generation state of the etch process performed in the etch chamber is normal.

8. The process monitoring method according to claim 7, prior to the step of determining whether the byproduct generation state of the etch process is normal comprises the following steps: acquiring a fourth difference between the third sub-difference and the fourth sub-difference, and determining whether the fourth difference is within a second preset range, the byproduct generation state being normal if the fourth difference is within the second preset range.

9. The process monitoring method according to claim 1, wherein the second preset range is acquired through the second theoretical mass and a yield of the semiconductor structure corresponding to the second theoretical mass.

10. The process monitoring method according to claim 8, wherein the second preset range is acquired through the second theoretical mass and a yield of the semiconductor structure corresponding to the second theoretical mass.

11. The process monitoring method according to claim 1, further comprising: determining, based on the etch state and the byproduct generation state, whether the etch process is in a normal state.

12. The process monitoring method according to claim 1, wherein the etch process comprises a high-aspect-ratio etch process.

13. A process monitoring system, applied to an etch chamber, the process monitoring system comprising:
an etch module configured to perform an etch process;
a simulation module configured to acquire a semiconductor structure on which an etch process is performed in the etch module, and generate a corresponding test structure based on the semiconductor structure;
a first acquisition module configured to acquire first theoretical mass of the semiconductor structure after the etch process is theoretically performed;
a first processing module connected to the etch module and the simulation module, configured to place the test structure in the etch module to actually perform the etch process, and acquire first residual mass of the test structure after the etch process is actually performed; and
a first determination module connected to the first acquisition module and the first processing module, configured to determine, based on the first theoretical mass and the first residual mass, whether an etch state of the etch process performed by the etch module is normal; and wherein the process monitoring system further comprises:
a transfer module configured to provide a substrate;
a second acquisition module configured to acquire second theoretical mass of the substrate after the etch process is theoretically performed;
a second processing module connected to the etch module and the transfer module, configured to place the substrate in the etch module to actually perform the etch process, and acquire second residual mass of the substrate after the etch process is actually performed; and
a second determination module connected to the second acquisition module and the second processing module, configured to determine, based on the second theoretical mass and the second residual mass, whether a byproduct generation state of the etch process performed by the etch module is normal; and, wherein determining whether the byproduct generation state of the etch process performed by the etch module is normal comprises:
acquiring a third difference between the second theoretical mass and the second residual mass; and
determining whether the third difference is within a second preset range, the byproduct generation state of the etch process being normal if the third difference is within the second preset range.

14. The process monitoring system according to claim 13, further comprising: a third determination module connected to the first determination module and the second determination module, configured to determine, based on the etch state and the byproduct generation state, whether the etch process is in a normal state.

* * * * *